United States Patent
Wu et al.

(10) Patent No.: US 6,459,638 B1
(45) Date of Patent: Oct. 1, 2002

(54) BUILT-IN PROGRAMMABLE SELF-DIAGNOSTIC CIRCUIT FOR SRAM UNIT

(75) Inventors: Chi-Feng Wu, Kaohsiung; Chih-Wea Wang, Taipei Hsien; Jin-Fu Li, Hsin Yuan Hsiang; Cheng-Wen Wu, Hsinchu; Chung-Chiang Teng, Hu-Kou Hsiang; Chih-Kang Chiu, Chu-Pei, all of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/901,371

(22) Filed: Jul. 9, 2001

(30) Foreign Application Priority Data

Apr. 2, 2001 (TW) ...................................... 090107845 A

(51) Int. Cl.[7] ................................................. G11C 7/00
(52) U.S. Cl. ........................................ 365/201; 714/733
(58) Field of Search ................................ 365/201, 154; 714/25, 734, 733

(56) References Cited

U.S. PATENT DOCUMENTS

| 5,301,156 A | * | 4/1994 | Talley ........................ 365/201 |
| 5,577,050 A | * | 11/1996 | Bair et al. .................. 371/10.2 |
| 6,067,262 A | * | 5/2000 | Irrinki et al. ................ 365/201 |
| 6,137,734 A | * | 10/2000 | Schoner et al. ............. 365/194 |

* cited by examiner

Primary Examiner—Richard Elms
Assistant Examiner—Anh Phung
(74) Attorney, Agent, or Firm—J.C. Patents

(57) ABSTRACT

A built-in programmable self-diagnostic circuit for finding and locating faults in a static random access memory (SRAM) unit. The circuit includes a plurality of multiplexers, a demultiplexer, a test pattern generator, a fault location indicator and a controller. The circuit uses either internal test instructions or pre-programmed test instructions to test the SRAM unit so that the exact location of any fault in the SRAM unit can be found and subsequently repaired.

4 Claims, 3 Drawing Sheets

BUILT-IN PROGRAMMABLE SELF-DIAGNOSTIC CIRCUIT FOR SRAM UNIT

CROSS-REFERENCE TO RELATED APPLICATION

This application claims the priority benefit of Taiwan application Ser. No. 90107845, filed Apr. 2, 2001.

BACKGROUND OF THE INVENTION

1. Field of Invention

The present invention relates to a built-in testing circuit for a static random access memory (SRAM) unit. More particularly, the present invention relates to a built-in programmable self-diagnostic circuit for an SRAM unit capable of finding the location of faulty devices within the SRAM unit.

2. Description of Related Art

Due to the rapid progress in semiconductor manufacturing technologies, the quantity of devices on an integrated circuit (for example, a system-on-chip (SOC)) has increased exponentially, especially for static random access memory (SRAM). Before an SRAM unit is ready for shipment, devices inside the SRAM must be thoroughly tested. However, to test each one of the devices inside the SRAM requires vast numbers of testing leads. Hence, special methods and circuits that require fewer leads have been developed to test SRAM devices.

FIG. 1 is a block diagram showing a conventional built-in self-testing circuit for an SRAM unit. As shown in FIG. 1, a system-on-chip 10 having a built-in test circuit 12 and a static random access memory (SRAM) unit 14 is provided. The built-in test circuit 12 has a plurality of testing leads for receiving test instructions and test pattern signals and outputting test results. The built-in test circuit 12 generates test instructions (such as read or write instructions) and test pattern signals (such as address, input/output data or control signals) according to data in a built-in look-up table. The test instructions and test pattern signals are used to test the various functions of the SRAM unit 14.

In general, testing functions of the built-in test circuit 12 are designed together with the system-on-chip (SOC) 10. Therefore, the testing functions of the built-in test circuit 12 are fixed after fabrication of the SOC 10 is completed. Because the testing functions are already fixed, it is impossible to initiate the testing of other functions. In addition, even if faults are found in the SRAM unit 14 through testing, the built-in test circuit 12 has no means of pinpointing the exact location of the fault for subsequent repair.

FIG. 2 is a block diagram showing another conventional built-in self-testing circuit for a SRAM unit. As shown in FIG. 2, a system-on-chip 20 having a microprocessor 22, a read-only-memory (ROM) unit 24 and a static random access memory (SRAM) unit 26 is provided. The microprocessor 22 has a plurality of test leads for receiving test instructions and test pattern signals and outputting test results.

After receiving test instructions and test patterns, the microprocessor 22 reads out test instructions (such as a read or a write instruction) and test signal patterns (such as address, input/output data or control signals) from the ROM unit 24. Thereafter, various functions of the SRAM unit 26 are tested. However, a test circuit having both a microprocessor and a ROM unit will occupy a large wafer area. Since the test circuit is probably only used once for testing the SRAM unit and has no other functions thereafter, the production of such a test circuit wastes wafer area and increases production cost.

SUMMARY OF THE INVENTION

Accordingly, one object of the present invention is to provide a programmable built-in self-diagnostic circuit for testing a static random access memory (SRAM) unit. The circuit is able to pinpoint the exact location of a fault in the SRAM unit while occupying less wafer area and costing less to produce than conventional test circuits.

To achieve these and other advantages and in accordance with the purpose of the invention, as embodied and broadly described herein, the invention provides a programmable built-in self-diagnostic method for testing the integrity of a SRAM unit. First, a test mode or an analysis mode is selected. A test instruction is read according to the selected mode and then the test instruction is checked to determine if the instruction is a terminal read instruction. If the instruction is terminal, a test termination signal is issued. On the other hand, if instruction in non-terminal, the instructions demanded by a test instruction set are executed. Thereafter, the termination of the test instruction set is checked. If the work demanded by the test instruction set is finished, control is returned to the step of reading the next test instruction. On the other hand, if the work demanded by the test instruction set is unfinished, the results obtained from the test instruction set are checked to determine if errors are produced. If no faults are found as a result of executing the test instruction set, control is returned to the step of executing the test instruction set. Conversely, if faults are found in the results of executing the test instruction set, an error signal and an error operation code are produced so that the exact location of the fault in the SRAM unit can be found. Finally, control is returned to the execution of the test instruction set.

This invention also provides a programmable built-in self-diagnostic circuit for detecting any faults in a SRAM unit. The circuit includes a plurality of multiplexers, a demultiplexer, a test pattern generator, a fault location indicator and a controller. The multiplexers are coupled to the SRAM unit for providing a test pattern signal to the SRAM unit. The demultiplexer is coupled to the SRAM unit for receiving output data from the SRAM unit. The test pattern generator is coupled to the multiplexers and the demultiplexer. The test pattern generator receives a test instruction set for generating a test pattern signal and sending the signal to the multiplexers. The test pattern generator also determines if the execution of the test instruction set is finished or not so that a termination signal can be issued. The test pattern generator also receives output data from the demultiplexer and compares it with internally stored data. When the output data and internally stored data are non-identical, an error signal and an error operation code are issued. The fault site indicator is coupled to the test pattern generator. The fault location indicator issues a test abnormal signal on receiving an error signal. The error operation code is subsequently transmitted serially to find the exact fault location in the SRAM unit. The controller is coupled to the test pattern generator. The controller permits a selection between a test mode and an analysis mode. A test instruction is read according to the mode selected. The read-out test instruction generates a test instruction set according to a look-up table. The test instruction set is output to the test pattern generator. The controller also receives the termination signal and determines if the reading of instructions from the test instruction set is complete or not.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
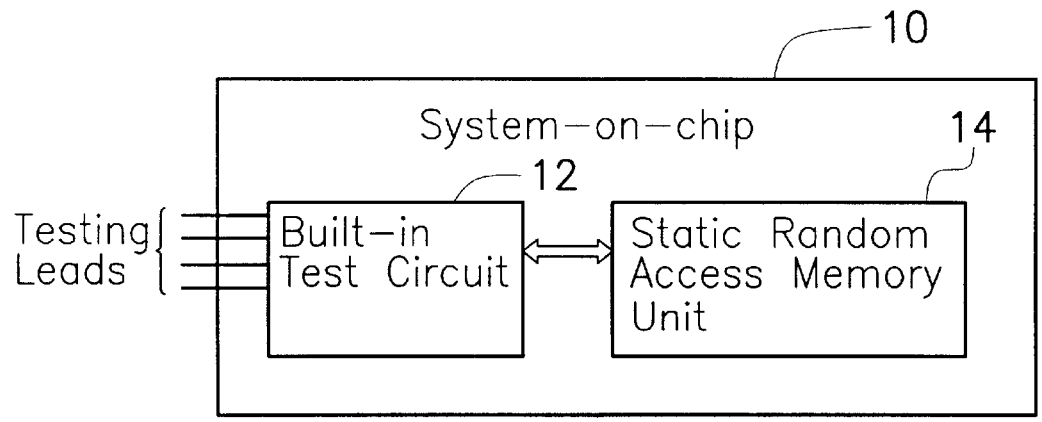
FIG. 1 is a block diagram showing a conventional built-in self-testing circuit for an SRAM unit.
Figure 2:
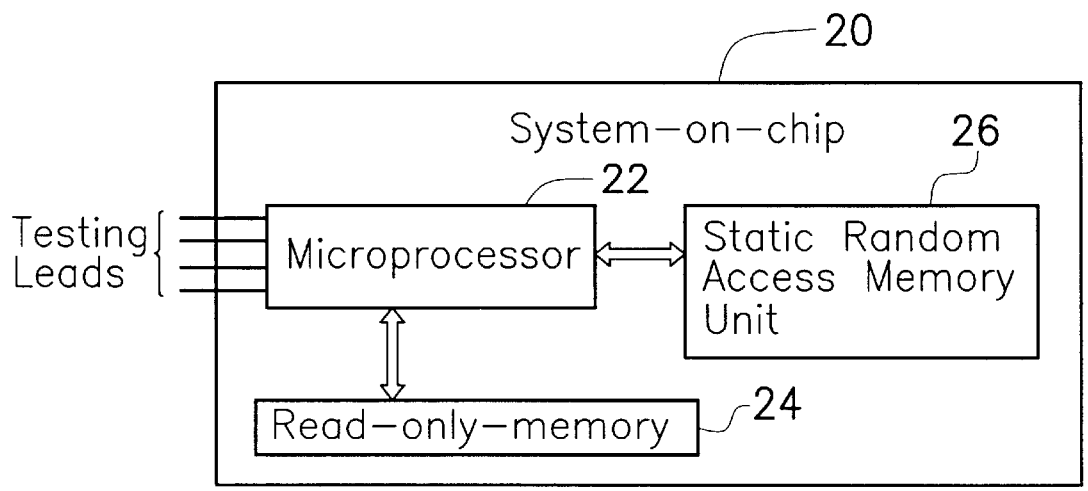
FIG. 2 is a block diagram showing another conventional built-in self-testing circuit for an SRAM unit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
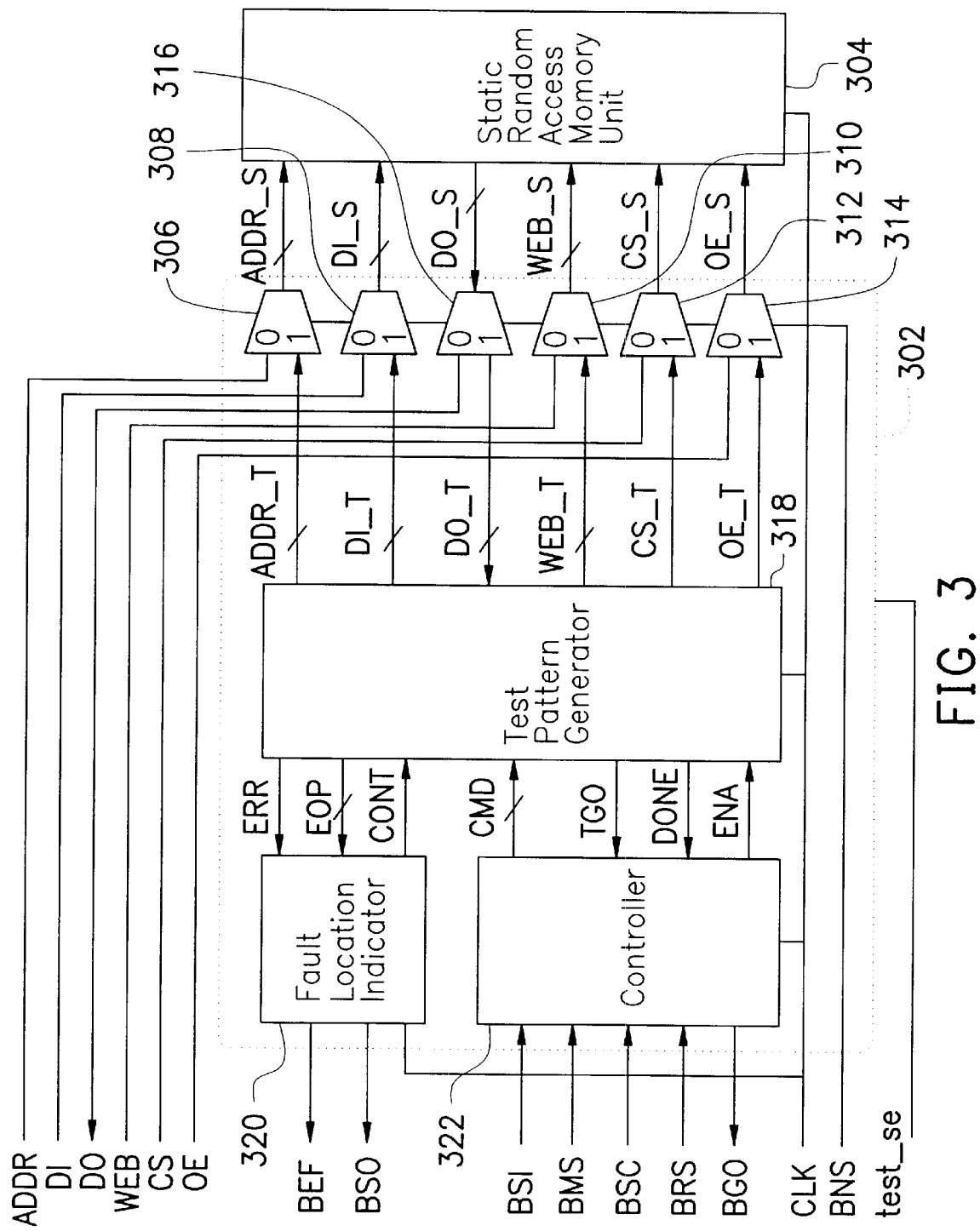
FIG. 3 is a block diagram showing a built-in programmable self-diagnostic circuit for testing an SRAM unit according to this invention.

FIG. 3 is a block diagram showing a built-in programmable self-diagnostic circuit for testing an SRAM unit according to this invention. As shown in FIG. 3, the built-in programmable self-diagnostic circuit 302 is used for checking on the normality of a static random access memory (SRAM) unit 304. The circuit 302 includes a plurality of multiplexers 306, 308, 310, 312, 314, a demultiplexer 316, a test pattern generator 318, a fault location indicator 320 and a controller 322.

The built-in programmable self-diagnostic circuit 302 has a test_se terminal. To check the functionality of the circuit 302, a test signal is delivered to the test_se terminal and a clock signal CLK is sent to the test pattern generator 318, the fault location indicator 320 and the controller 322. In the meantime, a test pattern signal is also delivered to the BSI terminal of the controller 322 so that all circuit functions of the built-in programmable self-diagnostic circuit 302 can be tested.

The multiplexers 306, 308, 310, 312 and 314 are coupled to the SRAM unit 304. Each multiplexer has a control terminal BNS capable of controlling the interception of test pattern signals including ADDR_T, DI_T, WEB_T, CS_T and OE_T coming from the test pattern generator 318. In addition, the control terminals BNS of the multiplexers are capable of intercepting system signals including ADDR, DI, WEB, CS and OE. Ultimately, the multiplexers 306, 308, 310, 312 and 314 output signals including ADDR_S, DI_S, WEB_S, CS_S and OE_S to the SRAM unit 304.

The demultiplexer 316 is coupled the SRAM unit 304 for receiving a DO_S signal from the SRAM unit 304. A control terminal BNS of the demultiplexer 316 controls the transfer of a DO_T signal to the test pattern generator 318 or the transfer of a DO signal to the system.

The test pattern generator 318 is coupled to the multiplexers 306, 308, 310, 314, 316 and the demultiplexer 316. The test pattern generator 318 receives a test instruction set from the controller 322 and generates test pattern signals (for example, ADDR_T, DI_T, WEB_T, CS_T and OE_T) going to the multiplexers 306, 308, 310, 312 and 314. The test pattern generator 318 receives the DO_T signal from the demultiplexer 316. A comparison of the received DO_T signal and an internally stored data signal inside the test pattern generator 318 is carried out. If the result of comparison shows some discrepancies, an error signal (ERR) and an error operation protocol (EOP) is delivered to the fault location indicator 320.

The fault location indicator 320 is coupled to the test pattern generator 318. When the fault location indicator 320 receives the error signal (ERR), a BEF terminal of the fault location indicator 320 transmits a pulse signal. Meanwhile, a BSO terminal of the fault location indicator 320 subsequently transmits the error operation protocol (EOP) serially so that the exact location of the fault in the SRAM unit 304 can be found.

The controller 322 is coupled to the test pattern generator 318. The controller 322 is permitted to select between a test mode and an analysis mode. According to the selected mode, test instructions are read. A test instruction set that corresponds to the read out test instruction is retrieved by referencing a look-up table. The test instruction set is output to the test pattern generator 318. The controller 322 also receives a termination signal from the test pattern generator 318 and determines if the test instruction set is fully read.

Figure 4:
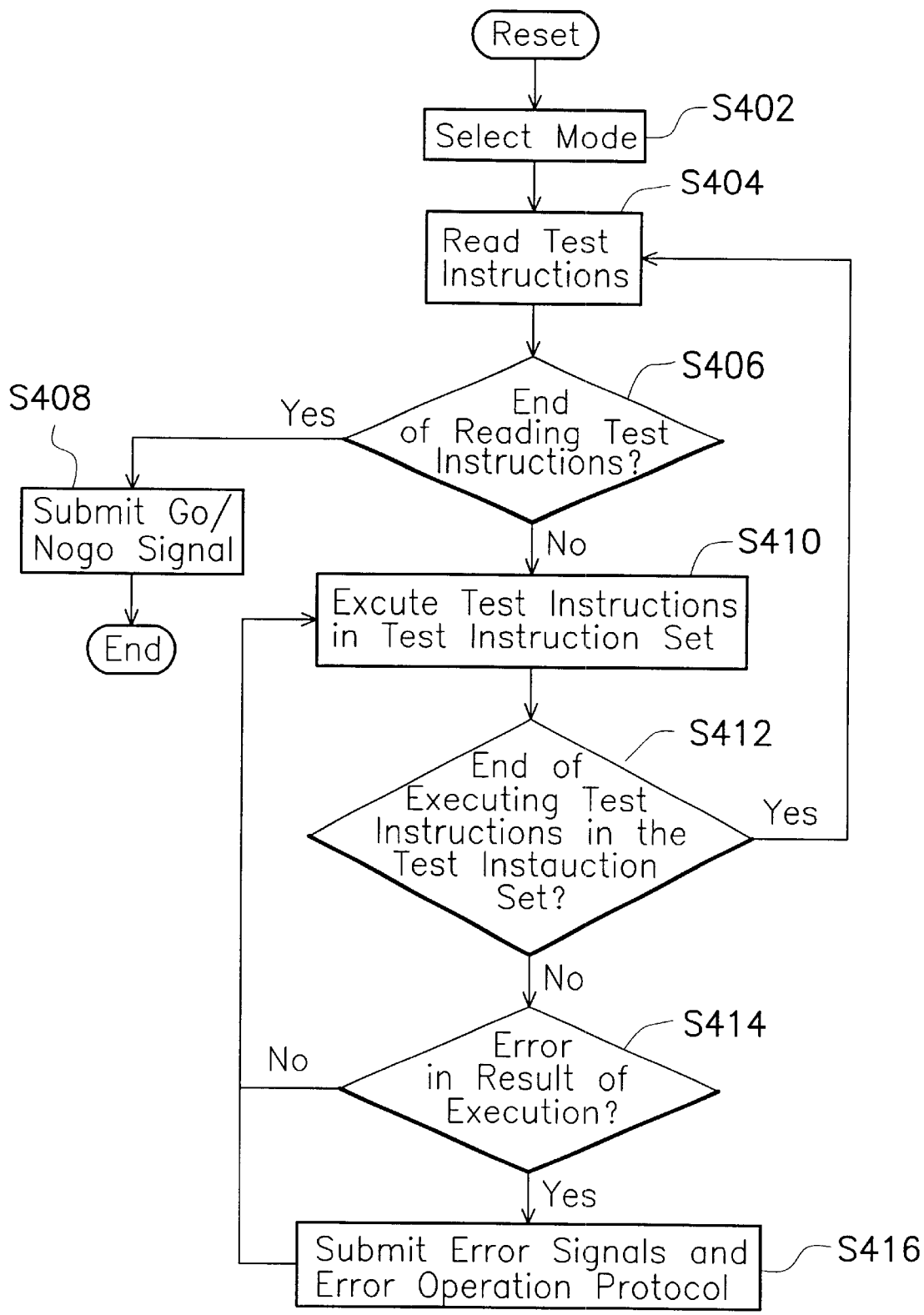
FIG. 4 is a flow chart showing the steps for operating the built-in programmable self-diagnostic circuit to test an SRAM unit according to this invention.

As shown in FIG. 3, the built-in programmable self-diagnostic circuit 302 is used for checking the functionality of the SRAM unit 304. FIG. 4 is a flow chart showing the steps for operating the built-in programmable self-diagnostic circuit 302 to test the SRAM unit 304 according to this invention.

First, a reset signal is sent to the BRS terminal of the controller 322 so that the controller 322 is in an initial state. A test mode or an analysis mode is selected by the controller 322 (S402). In the test mode, the controller 322 uses built-in test instructions to check the functions of the SRAM unit 304. Through the BSC terminal of the controller 322, the controller 322 is set to operate in a working state or an idle state. If the controller 322 is in the analysis mode, a high level signal must be sent to the BMS terminal of the controller 322. Moreover, test instructions must be transmitted from the BSI terminal of a user controller 322 so that the built-in programmable diagnostic circuit 302 can utilize its programming function to check the functions of the SRAM unit 304.

A test instruction is read according to the test mode or the analysis mode selected by the controller 322 (S404). After reading out the test instruction, the controller 322 determines if the test instruction is the end of reading (S406). If the test instruction is the end of reading, the BGO terminal of the controller 322 issues a Go/Nogo signal so that the results of testing the SRAM unit 304 is obtained (S408). On the other hand, if the test instruction is not an end of reading, the controller 322 generates a test instruction set that corresponds to the test instruction by looking up a table. The test instruction set is transferred from the CMD terminal of the controller 322 to the test pattern generator 318. The ENA terminal of the controller 322 then issues an execution signal to the test pattern generator 318 driving the test pattern generator 318 to execute the test instructions in the test instruction set (S410).

When the test pattern generator 318 executes the instructions in the test instruction set, the test pattern generator 318 will determine if the test instruction received is the last of the instructions (S412). If the test instruction received is the last instruction, the DONE terminal of the test pattern generator 318 will issue a signal to the controller 322 so that the controller 322 can execute the instructions shown in step S404. If the test instruction is not the final instruction, the test pattern generator 318 outputs signals (such as ADDR_T, DI_T, WEB_T, CS_T and OE_T) to the multiplexers 306, 308, 310, 312 and 314. Thereafter, test pattern signals (such as ADDR_S, DI_S, WEB_S, CS_S and OE_S) are transmitted from the multiplexers 306, 308, 310, 312, 314 to the SRAM unit 304. The SRAM unit 304 sends the execution result DO_S to the demultiplexer 316 and the demultiplexer 316 sends the DO_T signal to the test pattern generator 318.

A comparison of the DO_T signal received by the test pattern generator 318 and the stored data signal inside the test pattern generator 318 is carried out (S414). In the meantime, the test pattern generator 318 also sends a TGO signal to the controller 322 informing the test results of the SRAM unit 304 to the controller 322. If the comparison results in a match, this indicates that no errors are found in the SRAM unit 304 and the test pattern generator 318 executes step S410. On the other hand, if the comparison results in a mismatch, this indicates some errors were found in the SRAM unit 304 during the execution of the test instruction set. The test pattern generator 318 submits an error signal (ERR) to the fault location indicator 320. The test pattern generator 318 also submits an error operation protocol (EOP) to the fault location indicator by referencing an error table (S416).

As soon as the fault location indicator 320 receives the error signal (ERR), the test pattern generator is set to an idle state. In the meantime, the BEF terminal of the fault location indicator 320 sends out a pulse signal. The BSO terminal of the fault location indicator 320 also sends out the error operation protocol (EOP), which includes the received error address, the error operation indication and output test data, serially. After transmitting the error operation protocol (EOP), the fault location indicator 320 issues a CONT signal to the test pattern generator 318 that triggers the test pattern generator to execute step S410.

In summary, this invention provides a built-in programmable self-diagnostic circuit for testing an SRAM unit. The SRAM unit can be tested with preset instructions inside the circuit. Test instructions for testing the SRAM unit can also be programmed into the circuit. In addition, the circuit is able to pinpoint the exact location of a fault in the SRAM unit despite occupying less wafer area and costing less to produce than conventional test circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in programmable self-diagnostic method for finding functional faults in a static random access memory (SRAM) unit, comprising the steps of:

selecting a test mode or an analysis mode;

reading out a test instruction according to the mode chosen;

determining if the test instruction is an end of reading instruction;

sending out a test termination signal if the test instruction is an end of reading instruction;

executing a test instruction from a test instruction set if the test instruction is not an end of reading instruction;

determining if the execution of test instructions of the test instruction set is completed;

returning to the step of reading out a test instruction according to the mode chosen if the execution of test instructions of the test instruction set is completed;

determining if the results of executing the test instruction set indicate any errors if the execution of test instructions of the test instruction set remains unfinished;

returning to the step of executing the test instruction of the test instruction set if the results of executing the test instruction set indicate no errors; and sending out an error signal and an error operation protocol so as to find the fault location in the SRAM unit and returning to the step of executing the test instructions of the test instruction set if the results of executing the test instruction set indicate some errors.

2. The method of claim 1, wherein the step of selecting the analysis mode includes sending a serial selection signal capable of diagnosing the functions of a SRAM device from a user test instruction generating device.

3. The method of claim 1, wherein the read out test instructions of the test instruction set is obtained by referencing a look-up table.

4. The method of claim 1, wherein instruction execution is stopped after finding an error in the test, an error operation protocol that corresponds to the error is sent before continuing with the execution of the remaining non-executed instructions.

* * * * *